(12) United States Patent
Komatsu et al.

(10) Patent No.: US 11,128,097 B2
(45) Date of Patent: Sep. 21, 2021

(54) LIGHT SOURCE APPARATUS

(71) Applicant: Samsung Electronics Co., Ltd., Suwon-si (KR)

(72) Inventors: Akihiro Komatsu, Yokohama (JP); Tomoki Onishi, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 13 days.

(21) Appl. No.: 16/814,418

(22) Filed: Mar. 10, 2020

(65) Prior Publication Data

US 2021/0036477 A1 Feb. 4, 2021

(30) Foreign Application Priority Data

Aug. 2, 2019 (JP) .............................. JP2019-143096
Nov. 29, 2019 (KR) ........................ 10-2019-0157248

(51) Int. Cl.
| | | |
|---|---|---|
| *H01S 3/03* | (2006.01) | |
| *H01S 3/034* | (2006.01) | |
| *H01S 3/032* | (2006.01) | |
| *H01S 3/22* | (2006.01) | |
| *H01J 37/32* | (2006.01) | |
| *H01S 3/223* | (2006.01) | |
| *H05H 1/46* | (2006.01) | |

(52) U.S. Cl.
CPC ............ *H01S 3/034* (2013.01); *H01S 3/0323* (2013.01); *H01S 3/0326* (2013.01); *H01S 3/0346* (2013.01); *H01J 37/32339* (2013.01); *H01J 37/32513* (2013.01); *H01S 3/2207* (2013.01); *H01S 3/2215* (2013.01); *H01S 3/2222* (2013.01); *H01S 3/2232* (2013.01); *H01S 3/2237* (2013.01); *H05H 1/46* (2013.01)

(58) Field of Classification Search
CPC ...... H01S 3/034; H01S 3/2207; H01S 3/2215; H01S 3/2222; H01S 3/2232; H01S 3/2237; H01S 3/0326; H01S 3/0323; H01S 3/0346

See application file for complete search history.

(56) References Cited

U.S. PATENT DOCUMENTS

| | | | | |
|---|---|---|---|---|
| 9,844,125 B2 * | 12/2017 | Jhon | ...................... | H05G 2/008 |
| 10,779,388 B2 * | 9/2020 | Jeon | ...................... | H05G 2/008 |
| 2014/0048410 A1 * | 2/2014 | Benabid | ................ | H01J 65/042 |
| | | | | 204/157.43 |
| 2016/0073487 A1 * | 3/2016 | Yanagida | ............... | H05G 2/006 |
| | | | | 250/504 R |
| 2016/0192467 A1 * | 6/2016 | Jhon | ...................... | H05G 2/008 |
| | | | | 250/504 R |
| 2017/0358449 A1 * | 12/2017 | So | .......................... | H01S 3/038 |

FOREIGN PATENT DOCUMENTS

JP 2017-204442 A 11/2017

\* cited by examiner

*Primary Examiner* — Kinam Park

(74) *Attorney, Agent, or Firm* — Harness, Dickey & Pierce, P.L.C.

(57) ABSTRACT

A light source apparatus includes an airtight container having a hemispherical or semielliptical first curved portion configured to receive laser light, a hemispherical or semielliptical second curved portion opposite to the first curved portion, and a cylindrical portion connecting the first curved portion and the second curved portion; assist gas sealed in the airtight container; and a light source configured to irradiate laser light to the first curved portion from outside of the airtight container.

20 Claims, 9 Drawing Sheets

LIGHT SOURCE APPARATUS

CROSS-REFERENCE TO RELATED APPLICATION(S)

This application claims benefit of priority to Japanese Patent Application No. 2019-143096 filed on Aug. 2, 2019 in the Japan Patent Office and Korean Patent Application No. 10-2019-0157248 filed on Nov. 29, 2019 in the Korean Intellectual Property Office, the disclosures of which are incorporated herein by reference in its entirety.

BACKGROUND

1. Field

The present inventive concepts relate to light source apparatuses.

2. Description of Related Art

As a light source of an inspection light source or an extreme ultraviolet (EUV) exposure apparatus, a laser-produced plasma (LPP) light source has attracted attention. The LPP light source irradiates laser light to a target material in a liquid or gaseous state and provides EUV light from the target material irradiated with laser light and converted into a plasma state. For example, a plasma light emitting apparatus irradiates laser light to a gas sealed in a spherical target valve, and provides plasma light from the excited gas by irradiating the laser light.

In the case of a LPP light source apparatus with high brightness, due to high temperatures of a light emitter, an optical component, a housing and a valve may be exposed to an unsatisfactory environment. The unsatisfactory environment may shorten a maintenance cycle and lifespan of the LPP light apparatus with high brightness.

SUMMARY

An aspect of the present inventive concepts is to provide a light source apparatus having a longer lifespan by suppressing deterioration of an optical component, or the like.

According to an aspect of the present inventive concepts, a light source apparatus may include an airtight container having a hemispherical or semielliptical first curved portion receiving laser light, a hemispherical or semielliptical second curved portion opposite to the first curved portion, and cylindrical portion connecting the first curved portion and the second curved portion, assist gas sealed in the airtight container, and a light source configured to irradiate laser light to the first curved portion from outside of the airtight container.

According to an aspect of the present inventive concepts, a light source apparatus, may include a light source configured to irradiate laser light, an airtight container configured to receive the laser light, the airtight container having a first curved portion, and a cylindrical portion connected to the first curved portion, the airtight container including a tip portion, the tip portion being sealed, the tip portion in a position other than an optical axis of the laser light, the first curved portion being hemispherical or semielliptical, and assist gas sealed in the airtight container.

According to an aspect of the present inventive concepts, a light source apparatus, may include an airtight container having a first end portion receiving laser light, a second end portion opposite to the first portion, and a middle portion connecting the first end portion and the second end portion, the second end portion having a larger diameter than the first end portion, assist gas sealed in the airtight container, and a light source configured to irradiate laser light to the first end portion from outside of the airtight container.

In an example embodiment, a light source apparatus may be provided with a tip portion for closing the airtight container after the assist gas is sealed in the cylindrical portion.

In an example embodiment, the light source apparatus may be provided with a tip portion for closing the airtight container after the assist gas is sealed in the second curved portion other than an extension line of an optical axis of the laser light.

In an example embodiment, the light source apparatus may be provided with a mirror for reflecting laser light for the light source to irradiate the laser light to the first curved portion of the airtight container, and a curved shape of the first curved portion may have a shape into which the laser light is vertically incident.

In an example embodiment, assist gas used in the light source apparatus may include at least one of Ar, Kr, Xe, He, Ne, $N_2$, $Br_2$, $Cl_2$, $I_2$, $H_2O$, $O_2$, $H_2$, $CH_4$, NO, $NO_2$, $CH_3OH$, $C_2H_5OH$, $CO_2$, $NH_3$, one or more metal halides, a Ne/Xe mixture, an Ar/Xe mixture, a Kr/Xe mixture, an Ar/Kr/Xe mixture, an ArHg mixture, a KrHg mixture, and a XeHg mixture.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
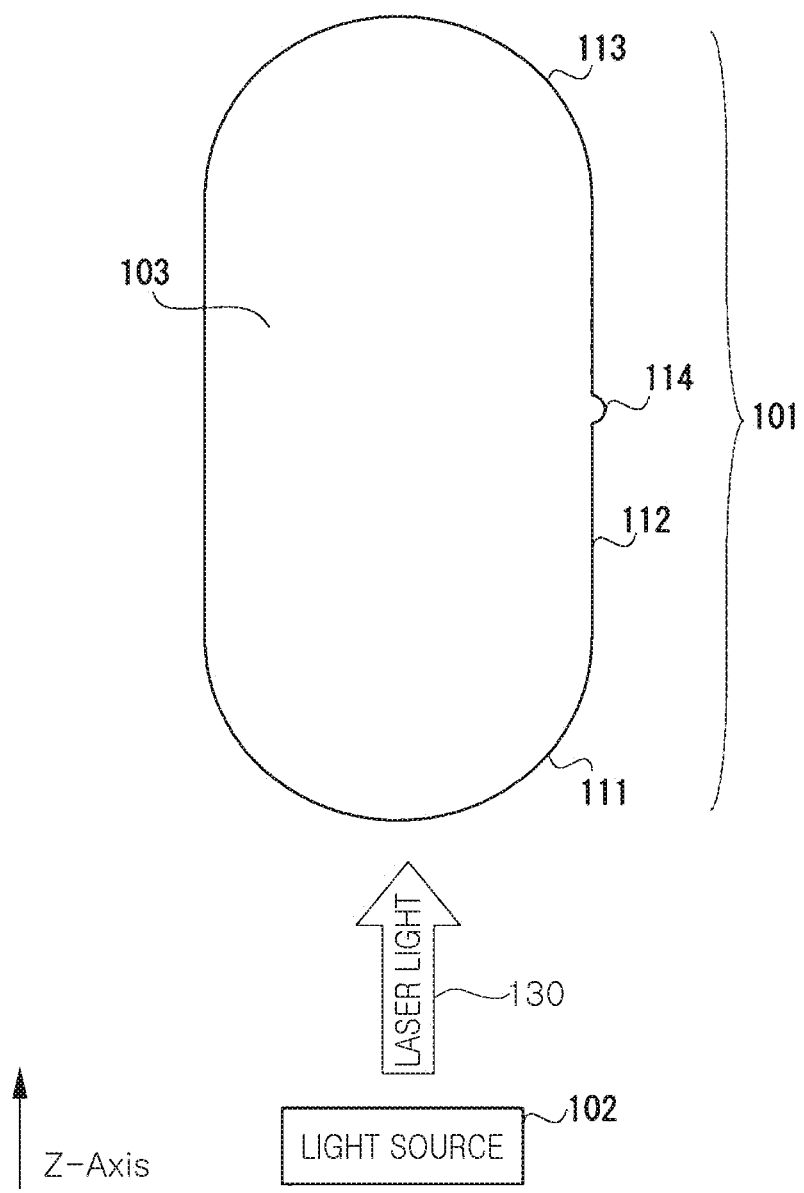
FIG. 1 is a view illustrating a light source apparatus according to some example embodiments of the present inventive concepts.

Hereinafter, example embodiments of the present inventive concepts will be described in detail with reference to the accompanying drawings. The same reference numerals are used for the same components in the drawings, and duplicate descriptions of the same components will be omitted.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a view illustrating a light source apparatus according to example embodiments of the present inventive concepts.

Referring to FIG. 1, a light source apparatus 100 may include an airtight container 101, a light source 102, and assist gas 103.

The airtight container 101 may be an airtight container in which the assist gas 103 is sealed. The airtight container 101 may be formed of a material capable of transmitting light generated from laser light and excited assist gas. For example, the airtight container 101 may be formed of quartz or sapphire. In other examples, the airtight container 101 may be formed of glass. In addition, the airtight container 101 may be formed of fused quartz glass.

The airtight container 101 may include a first curved portion 111, a cylindrical portion 112, a second curved portion 113, and a tip portion 114.

The first curved portion 111 may transmit the laser light irradiated from outside of the airtight container 101 into the airtight container 101. The first curved portion 111 may have a shape capable of transmitting the laser light with no or low levels of loss. For example, the first curved portion 111 may have a shape orthogonal to the laser light. In other example embodiments, the first curved portion 111 may have a hemispherical shape or a semielliptical shape, although example embodiments are not limited thereto.

The cylindrical portion 112 may have a cylindrical shape, and may connect the first curved portion 111 and the second curved portion 113. When the first curved portion 111 and the second curved portion 113 are hemispherical, the cylindrical portion 112 may have a hollow cylindrical shape or a semielliptical shape. When the first curved portion 111 and the second curved portion 113 are hemispherical, the cylindrical portion 112 may have a hollow cylindrical shape or a semielliptical shape, although example embodiments are not limited thereto.

The second curved portion 113 may have a shape that assists in heating (e.g., through convection) the assist gas 103 in the airtight container 101. For example, the second curved portion 113 may have a hemispherical shape. The second curved portion 113 may be opposite the first curved portion 111.

The tip portion 114 may be a portion in which an opening in the airtight container 101 through which the assist gas 103 was injected has been closed so that the airtight container 101 has a predetermined or alternatively, desired, shape. In other words, the tip portion 114 may be an opening that is closed after injecting the assist gas 103 into the airtight container 101, thereby sealing the airtight container 101 with a closed shape. As a result, the tip portion 114 may have a relatively lower degree of strength than other portions of the airtight container 101. Therefore, the tip portion 114 may be disposed in a position in which the laser light is not directly irradiated, or focused. For example, the tip portion 114 may be disposed on a side surface of the cylindrical portion 112, as illustrated in FIG. 1, although a person of ordinary skill in the art would recognize the tip portion 114 may be in other locations. In addition, the tip portion 114 may be disposed in a region of the side surface of the second curved portion 113 that does not meet the optical axis of the laser light.

The light source 102 may generate laser light 130 that excites the assist gas 103. The laser light 130 generated by the light source 102 may have a predetermined or alternatively, desired, wavelength capable of exciting the assist gas 103. The light source 102 may be a light source capable of generating general laser light.

The light source 102 may be installed in a position a direction in which the laser light can be irradiated to the first curved portion 111 of the airtight container 101. In some example embodiments, the light source 102 may further include optical elements such as mirrors, lenses, and the like. Meanwhile, in FIG. 1, for convenience of description, the light source 102 is represented by a functional block rather than an actual shape.

The assist gas 103 may include gas that may be converted into a plasma state by being irradiated with laser light. For example, the assist gas 103 may be gas including at least one of Ar, Kr, Xe, He, Ne, $N_2$, $Br_2$, $Cl_2$, $I_2$, $H_2O$, $O_2$, $H_2$, $CH_4$, NO, $NO_2$, $CH_3OH$, $C_2H_5OH$, $CO_2$, $NH_3$, one or more metal halides, a Ne/Xe mixture, an Ar/Xe mixture, a Kr/Xe mixture, an Ar/Kr/Xe mixture, an ArHg mixture, a KrHg mixture, and a XeHg mixture. For example, the assist gas 103 may be xenon (Xe) gas. The assist gas 103 may be referred to as working gas or ionizing gas, and may have a solid state at a low temperature. Through the above-described configurations, the light source apparatus 100 may emit light.

Hereinafter, a movement path of the assist gas 103 in the airtight container 101 of the light source apparatus 100 according to some example embodiments of the present inventive concepts will be described in comparison with a case of the Comparative Example.

Figure 2:
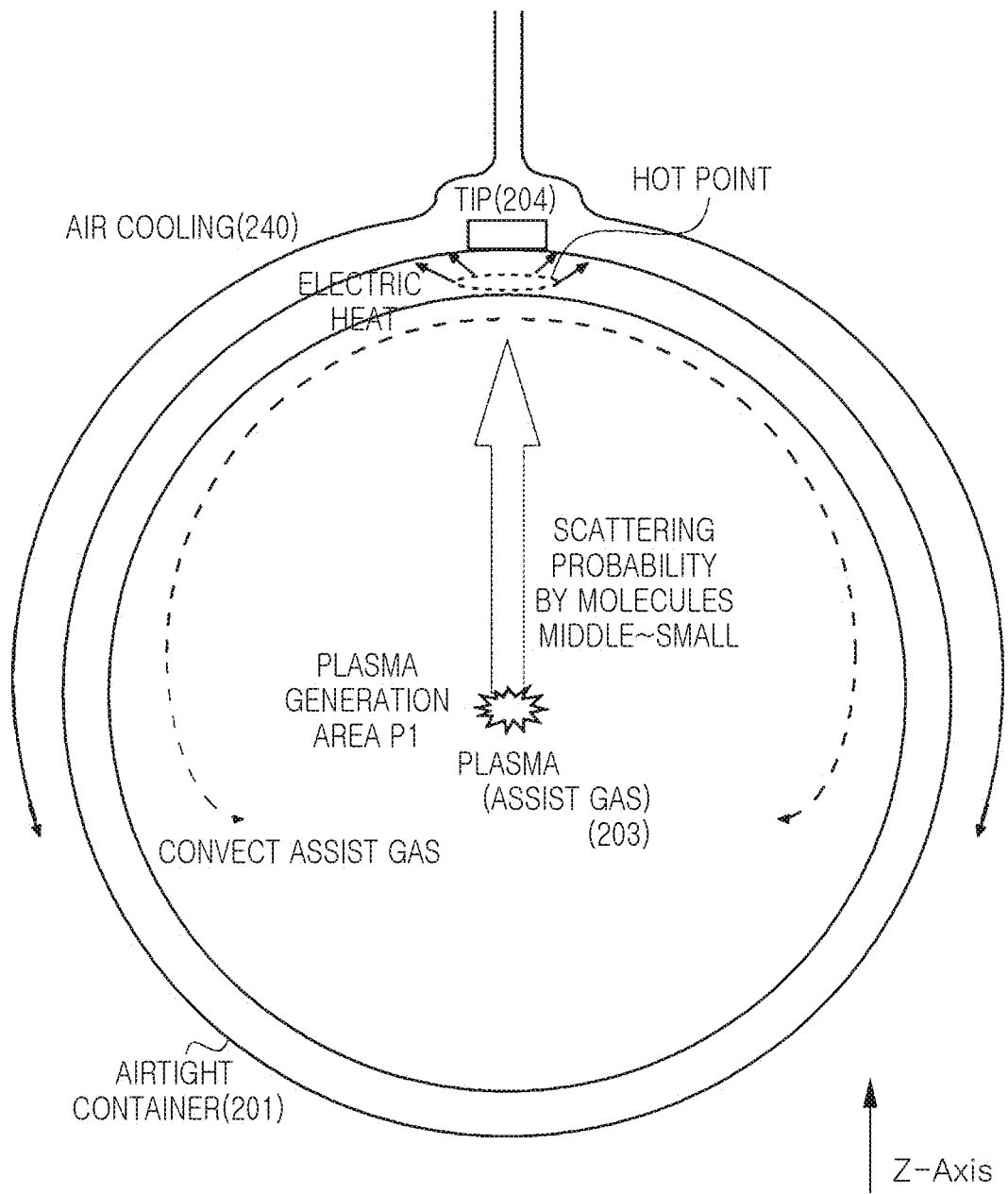
FIG. 2 is a view illustrating an example of movement of assist gas in a spherical airtight container in the light source apparatus according to a Comparative Example.
Figure 3:
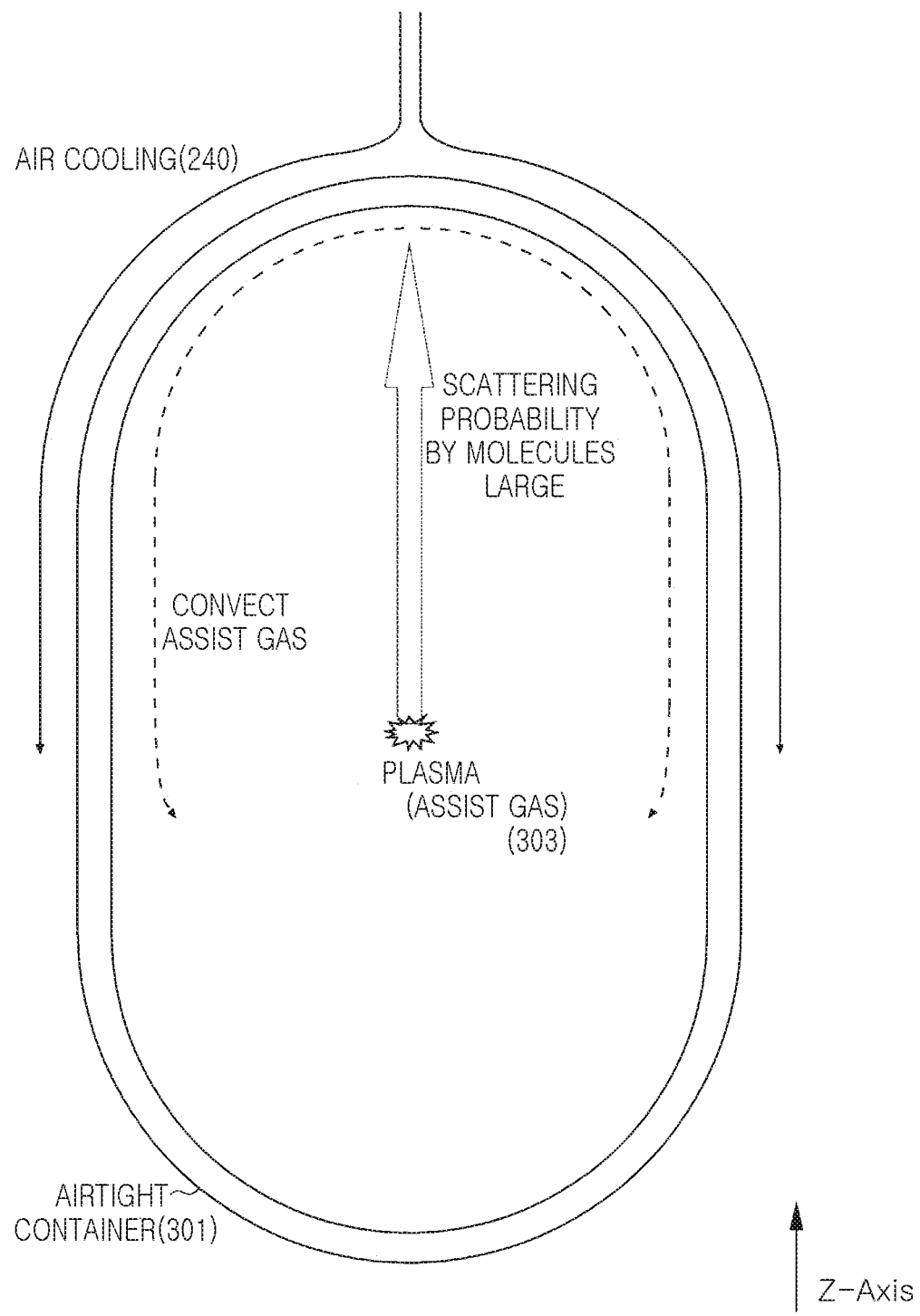
FIG. 3 is a view illustrating an example of movement of assist gas in the airtight container in the light source apparatus according to some example embodiments of the present inventive concepts.

FIG. 2 is a view illustrating a movement path of assist gas 203 in an airtight container 201 in a light source apparatus according to Comparative Example, and FIG. 3 is a view illustrating a movement path of assist gas 303 in an airtight container 301 in the light source apparatus according to an example embodiments of the present inventive concepts.

First, referring to FIG. 2, the assist gas 203 in the airtight container 201 may be converted into a plasma state by being irradiated with laser light. The assist gas converted into the plasma state emits a part of excited gas as light, and at the same time, recombination between charged particles of plasma may occur.

In this case, molecules of the assist gas 203 may be accelerated by a rocket action (or reaction effect), such that the assist gas 203 may move toward a wall surface of the airtight container 201 in the optical axis direction (e.g., Z-axis direction) of the laser light. Since the airtight container 201 has a spherical shape, the probability (or, the number of collisions) of the assist gas 203 colliding with other gas molecules moving randomly until reaching the wall surface of the airtight container 201 may be relatively low. Therefore, the assist gas 203 may reach the wall surface of the airtight container 201 in a state in which an energy loss is relatively low.

The assist gas 203, which has become a high-speed molecular flow, reaches the wall surface of the airtight container 201 and loses a lot of kinetic energy. The assist gas 203 may heat the wall surface of the airtight container 201 and may be reduced to low temperature gas molecules. For example, when the assist gas 203 collides with the wall surface of the airtight container 201, a part of the kinetic energy of the assist gas 203 may be converted into heat and transferred to the wall surface of the airtight container 201. Thereafter, through convection, the assist gas 203 may move along the wall surface of the airtight container 201.

In the airtight container 201, a region in which the assist gas 203 reaches may have the highest temperature in the airtight container 201. However, when comparing the temperature by including the assist gas 203 in the airtight container 201, the plasma region P1 may have the highest temperature provided that an amount of radiation from the plasma region P1, which is a region in which the assist gas 203 is converted into a plasma state, to the wall surface of the airtight container 201, is small.

Additionally, the airtight container 201 may have temperature controlled by air cooling 240. The air cooling 240 may be a temperature controlled stream of air, or gas, that is directed over the airtight container 201. The air cooling 240 may be directed at the tip 204, at an area of heating of the airtight container 201, or both. The air cooling may be atmosphere, or may be an elemental gas or combination thereof (e.g., $N_2$, $O_2$, etc.).

Next, referring to FIG. 3, the light source apparatus according to an example embodiments of the present inventive concepts may have the same light emission principle as the light source apparatus according to Comparative Example of FIG. 2 in that they emit light by irradiating laser light to the assist gas in the airtight container to convert it into a plasma state. Additionally, the light source apparatus of FIG. 3 may have an air cooling similar to that of FIG. 2.

However, unlike Comparative Example of FIG. 2 including the airtight container 201 having a spherical shape, the light source apparatus according to example embodiments may include an airtight container 301 having an elliptical, or elongated, shape having a long axis in a moving direction of assist gas 303. Therefore, the probability (or, the number of collisions) of the assist gas 303 colliding with other gas molecules moving randomly until reaching the wall surface of the airtight container 301 by a rocket action (or reaction effect) may be higher. As a result, the assist gas 303 in a state in which energy is deprived due to collision with other gas molecules, so that the heat energy transferred by the assist gas 303 to the wall surface of the airtight container 301 may be relatively small as compared with the case of Comparative Example. Thereafter, through convection, the assist gas 303 may move along the wall surface of the airtight container 301.

As a result of performing a simulation by irradiating laser light after the assist gas 203 is sealed in the spherical airtight container 201 according to Comparative Example of FIG. 2, a glass wall surface of the airtight container 201 may be crystallized and became cloudy within 1000 hours. In addition, cracks may occur in a crystal portion of the airtight container 201. This can be interpreted as a result of the assist gas 203 having sufficient energy to alter the glass composition, thereby promoting the crystallization of the glass (e.g., amorphous) wall surface of the airtight container 201 together with high temperature conditions. If glass exceeds a characteristic plastic deformation region, a strength of the glass may be weakened. Therefore, when a temperature of the glass wall surface exceeds a predetermined or alternatively, threshold, temperature, a high-pressure airtight container 201 may rupture. In addition, in the spherical airtight container 201, since the tip portion 204 for encapsulating the gas based on the optical design may be disposed above the airtight container 201, the crystallization of the glass may have a great effect on the overall strength of the airtight container 201.

On the contrary, as a result of performing a simulation by irradiating laser light after the assist gas 303 is sealed in the elliptical airtight container 301 according to an example embodiments of FIG. 3 of the present inventive concepts, it is shown that a rise in a wall surface temperature of the airtight container 301 or the degree of rise in the wall surface temperature was lower than in the case of the Comparative Example. Since a distance from the airtight container 301 of FIG. 3 to the assist gas 303 reaching the wall surface of the airtight container 301 is longer than that of FIG. 2, it can be interpreted that the probability (or, the number of collisions) in which the assist gas 303 may collide with other gas molecules, may be relatively high, thereby losing more kinetic energy.

To summarize the above simulation results, it can be confirmed that the light source apparatus according to an example embodiments of the present inventive concepts may employ the airtight container 301 having an elliptical shape, thereby reducing or preventing the crystallization of the glass wall surface of the airtight container 301 and thus reduce or prevent a decrease in strength of the airtight container 301.

Hereinafter, a phenomenon of deterioration of the light source apparatus according to the wall surface temperature of the airtight container will be described in more detail with reference to the accompanying drawings.

Figure 4:
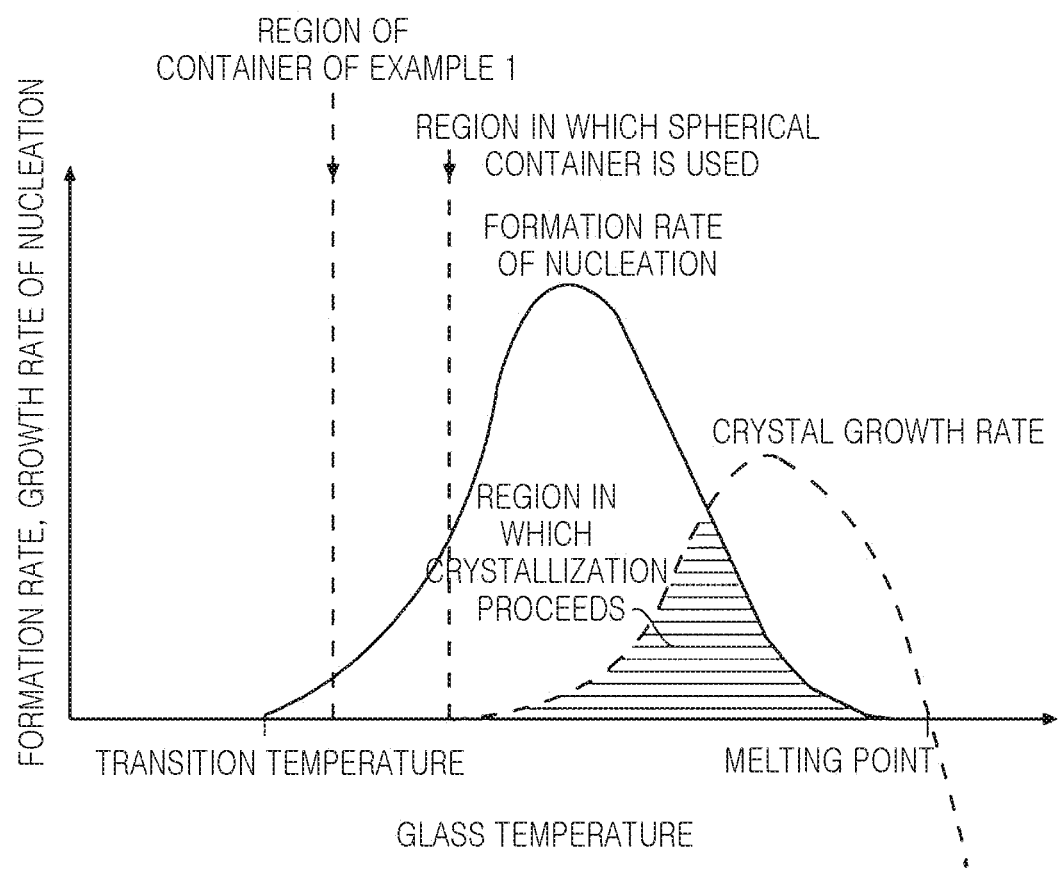
FIG. 4 is a graph illustrating a relationship between a temperature of glass and a formation rate and a growth rate of nucleation.

FIG. 4 is a graph illustrating a relationship between a temperature of glass and a rate of nucleation and growth.

In the graph of FIG. 4, a vertical axis represents the rate of nucleation and growth in the glass, and a horizontal axis represents the temperature of the glass.

Referring to FIG. 4, when the temperature of the glass is higher than a predetermined or alternatively, threshold, transition temperature, nuclei may be formed in the glass. As the temperature of the glass becomes higher, the glass begins to crystallize, and when the temperature of the glass exceeds a predetermined or alternatively, threshold, temperature, the glass may fail to maintain strength and may be broken. As such, since amorphous glass has a property of crystallizing as temperature increases, it may be desirable that the temperature of the glass wall surfaces of the airtight container be as low as possible.

Figure 5:
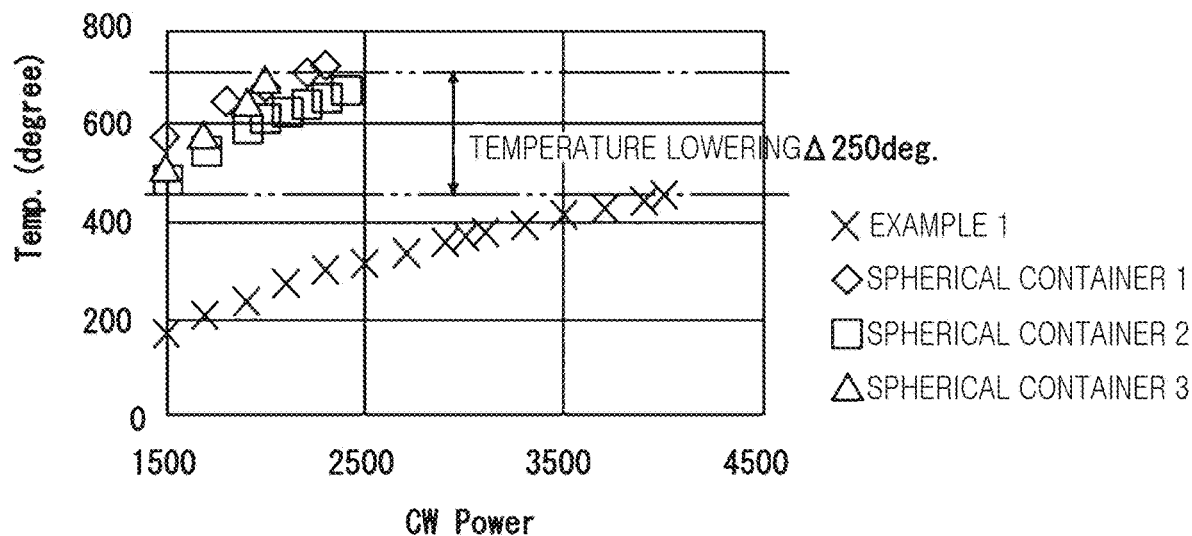
FIG. 5 is a graph illustrating a relationship between a continuous wave (CW) power of a laser and the temperature of the airtight container.

FIG. 5 is a graph illustrating a relationship between continuous wave (CW) power and the temperature of the airtight container. In the graph of FIG. 5, a vertical axis represents a temperature (° C.) of the airtight container, and a horizontal axis represents CW power (W) of a laser reflected from the airtight container.

Referring to FIG. 5, in the case of an airtight container having a spherical shape according to Comparative Examples, spherical containers 1, 2, and 3 (indicated by polygonals), when the CW power is about 2500W, the wall surface temperature of the airtight container may be about 650° C. to about 750° C.

On the contrary, in the case of an airtight container having an elliptical shape according to an example embodiments of the present inventive concepts, for example, airtight container 301 (indicated by X), when the CW power is about 2500W, the wall surface temperature of the airtight container may be about 350° C. or less. In addition, even when the CW power is raised to about 4000 W, the wall surface temperature of the airtight container may be about 450° C., which may be lower than that of the Comparative Examples.

As a result, it can be confirmed that an light source apparatus according to an example embodiments of the present inventive concepts may lower the wall surface temperature of the airtight container by greater than or equal to about 250° C., as compared to the airtight container having the spherical shape according to the Comparative Examples, by employing the airtight container having an elliptical shape.

Figure 6:
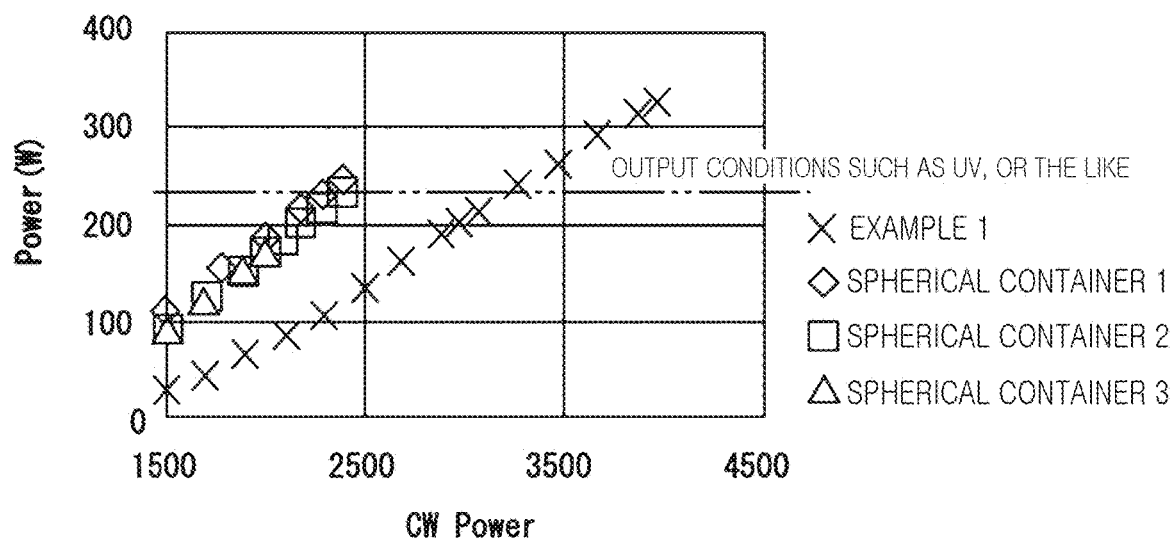
FIG. 6 is a graph illustrating relationship between a CW power and ultraviolet (UV) power of a laser.

FIG. 6 is a graph illustrating a relationship between the CW power and ultraviolet (UV) power of the laser. In the graph of FIG. 6, a vertical axis represents the UV power (W), and a horizontal axis represents the CW power (W) of the laser irradiated to the airtight container.

Referring to FIG. 6, together with FIG. 5, in the case of airtight container having a spherical shape according to Comparative Examples (indicated by polygonals), when the CW power is about 2500 W, the wall surface temperature of the airtight container may be about 650° C. to about 750° C. When the wall surface temperature of the airtight container is raised to about 750° C. or more, the airtight container may be damaged and thus the CW power cannot be safely increased to about 2500 W or more. In other words, in the light source apparatus according to the Comparative Examples, it is possible to raise the UV power to about 240 W, corresponding to the CW power of about 2500 W, by employing an airtight spherical container.

On the contrary, in the case of an airtight container having an elliptical shape according to an example embodiments of the present inventive concepts (indicated by X), even if the CW power is increased to about 4000 W, the wall surface temperature of the airtight container 101 may only be about 450° C., and the UV power may be about 340 W. In other words, the light source apparatus according to example embodiments of the present inventive concepts may lower the wall surface temperature of the airtight container and increase the UV power as compared with the Comparative Examples, by employing the airtight container having an elliptical shape. In addition, since the light source apparatus may maintain the wall surface temperature of the airtight container below a softening point or crystallization point of the glass by employing the airtight container having the elliptical shape, thereby further extending the lifespan of the light source apparatus. This may allow, for example, greater ranges of power output to be used, for longer periods and lifecycles.

As described above, the light source apparatus according to the example embodiments of the present inventive concepts described above with reference to FIGS. 1 to 6 may include a first curved portion, a second curved portion, and a cylindrical portion, such that the airtight container has an elliptical shape. Since the airtight container has an elliptical shape, the assist gas converted into a plasma state inside the airtight container becomes a high-speed molecular flow, and a distance taken to reach the wall surface of the airtight container may be increased, and the temperature of the assist gas at the time of reaching the wall surface may be lowered. As a result, the light source apparatus may suppress a sudden increase in the wall surface temperature of the airtight container and may extend the lifespan of the light source apparatus. In addition, the light source apparatus may further increase the UV power emitted while preventing damage to the airtight container. Further, as the light source apparatus has a structure in which a flow of the assist gas converted into the plasma state is unlikely to reach a tip portion of the airtight container, the chances of crystallization or cracking at the tip portion having relatively weak strength may be reduced or prevented.

Figure 7:
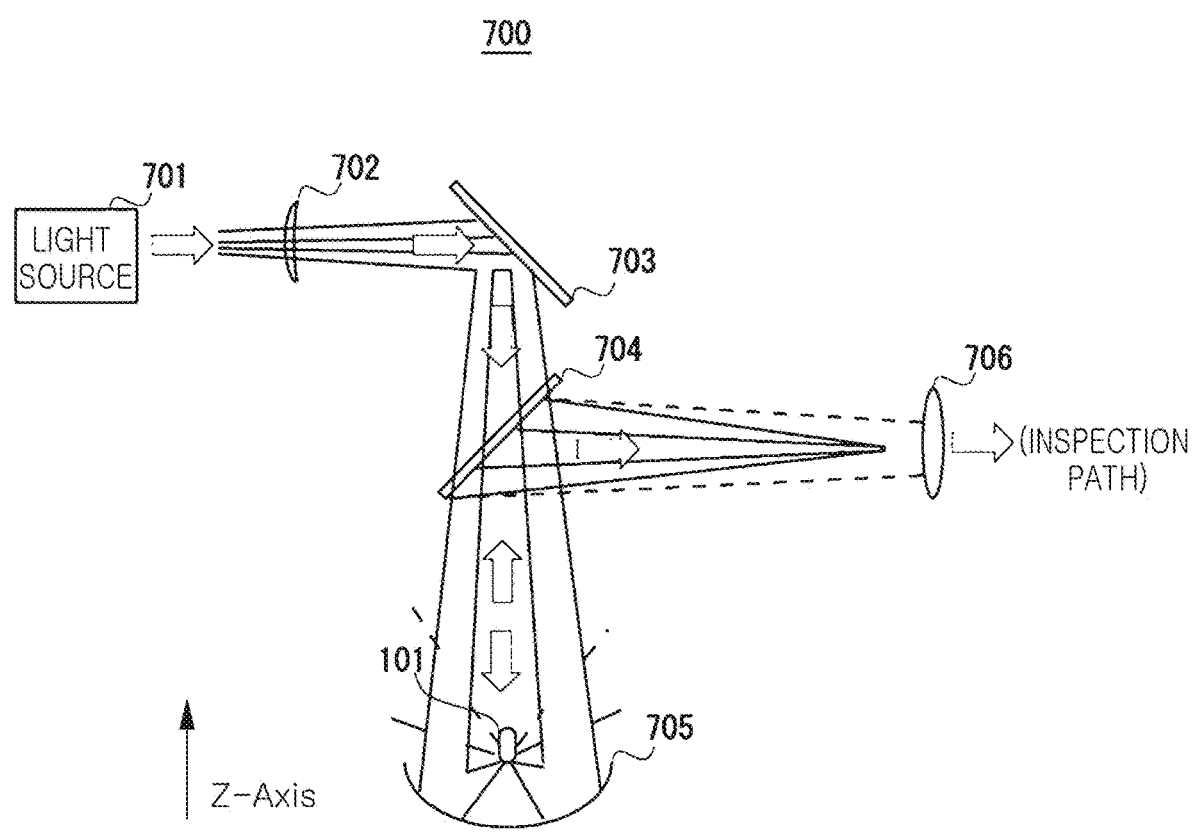
FIG. 7 is a view illustrating a light source apparatus according to example embodiments of the present inventive concepts.

FIG. 7 is a view illustrating a light source apparatus according to example embodiments of the present inventive concepts. The light source apparatus of FIG. 7 may further include a lens and a mirror as an optical system, unlike the light source apparatus of FIG. 1.

Referring to FIG. 7, a light source apparatus 700 may include a light source 701, a lens 702, a mirror 703, a half mirror 704, an elliptical mirror 705, an airtight container 101, and a lens 706. The same reference numerals as those of the light source apparatus of FIG. 1 represent the same components, and redundant descriptions thereof will be omitted.

The light source 701 may generate laser light for exciting the assist gas 103 in the airtight container 101. The light source 701 may emit laser light toward the lens 702.

The lens 702 may refract the laser light emitted by the light source 701 at a predetermined or alternatively, desired, angle. In some example embodiments, the lens 702 may be a concave lens, and may have a structure that increases a width of the laser light. In some example embodiments, the lens may be a flat or convex lens.

The half mirror 704 may transmit laser light reflected by the mirror 703 and direct the laser light in direction of the elliptical mirror 705. In addition, the half mirror 704 may further reflect the light reflected by the mirror 703 and direct the laser light in the direction of the lens 706.

The elliptical mirror 705 may converge laser light transmitted through the half mirror 704 and may allow the converged laser light to be irradiated to, or shine on, the airtight container 101.

The lens 706 may refract the laser light emitted from the airtight container 101 to have parallel light rays. Parallel light rays generated by the lens 706 may be used for an inspection machine, or the like.

As such, the light source apparatus 700 according to some example embodiments of the present inventive concepts may condense laser light and irradiate the laser light to the airtight container 101 such that the laser light with a larger output may be irradiated to the airtight container 101, thereby further increasing the light emission output of the airtight container 101.

In some example embodiments, the first curved portion below the airtight container 101 may have a curved shape to make the laser light reflected by the elliptical mirror 705 vertically incident. For example, the first curved portion may have a hemispherical shape. Since the first curved portion has a curved shape, the laser light may be condensed inside the airtight container 101 without being refracted by the first curved portion. As a result, an attenuation (or, scattering) phenomenon of the laser light may be suppressed when the laser light is condensed.

Meanwhile, the configuration of the light source apparatus 700 according to example embodiments of the present inventive concepts may be modified to have a variety of shapes different from the shape shown in FIG. 7 without losing the function thereof. For example, the cylindrical portion of the airtight container 101 may have a straight or curved-shaped cross-section in the optical axis direction of the laser light.

Figure 8:
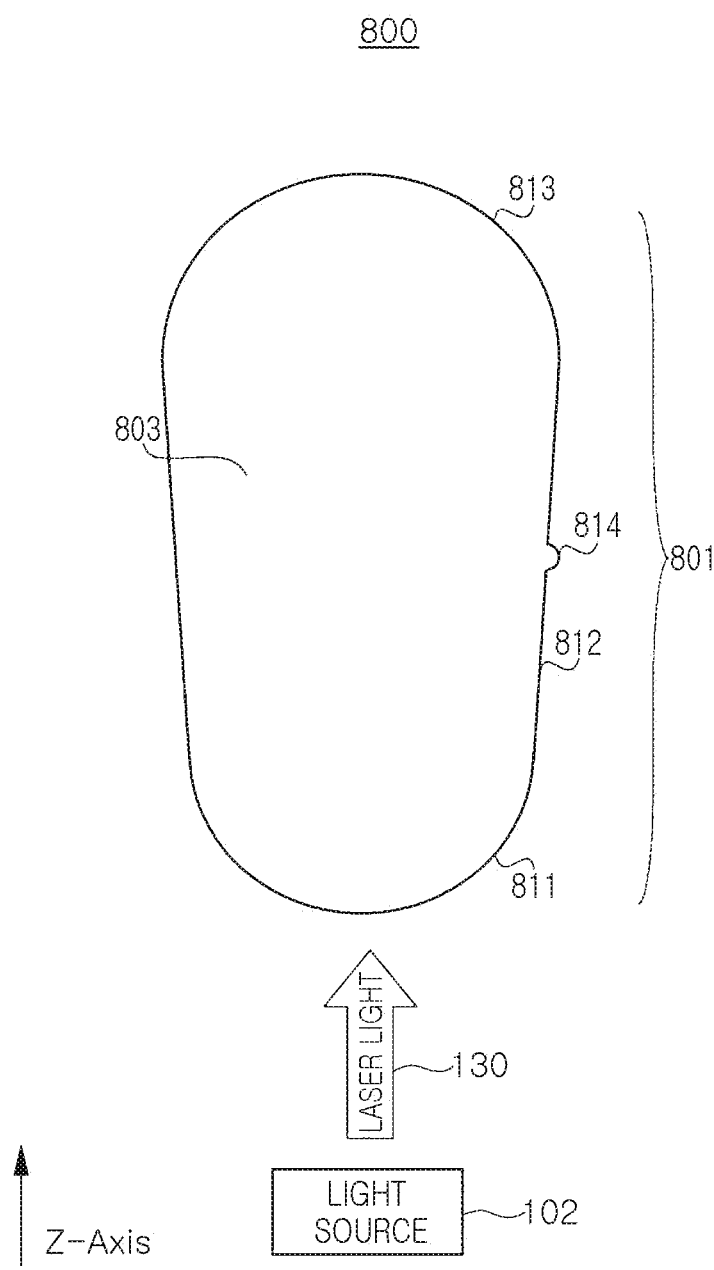
FIGS. 8 to 10 are views illustrating an airtight container of a light source apparatus according to example embodiments of the present inventive concepts.
Figure 9:
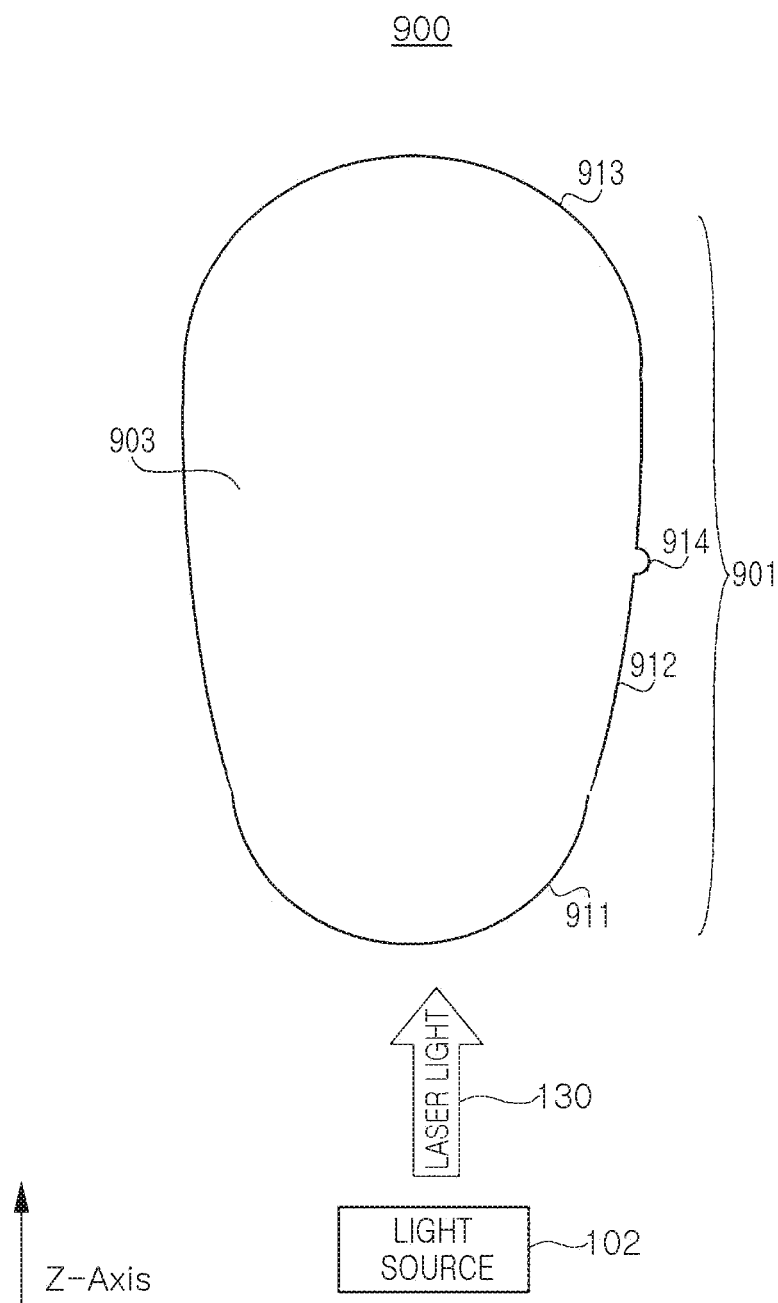
Figure 10:
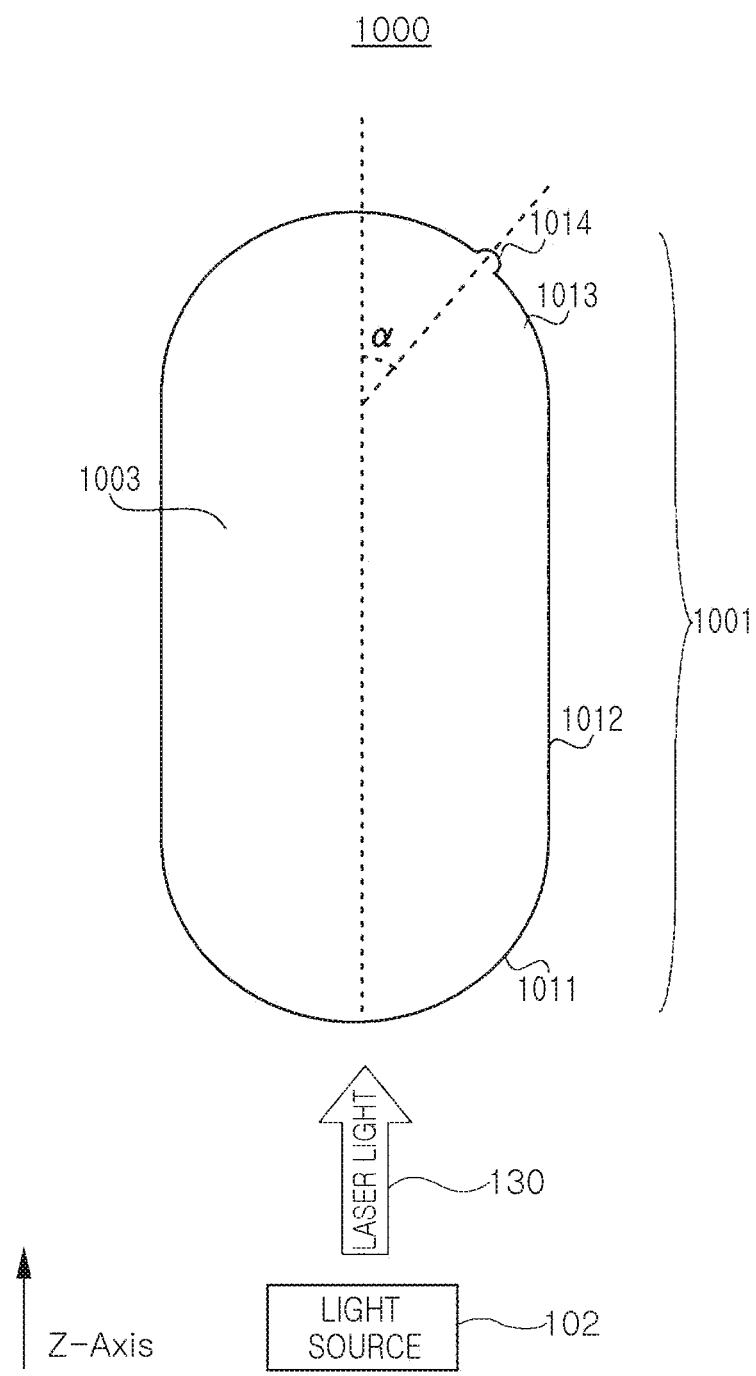

FIGS. 8 to 10 are cross-sectional views illustrating an airtight container of a light source apparatus according to various example embodiments of the present inventive concepts. FIGS. 8 to 10 may include light source 102 configured to generate laser light 130 as in FIG. 1.

First, referring to FIG. 8, in an airtight container 801 according to example embodiments of the present inventive concepts, an opening diameter of a second curved portion 813 may be larger than an opening diameter of a first curved portion 811. In addition, an opening of a cylindrical portion 812 has a size corresponding to the opening of the first curved portion 811 and the opening of the second curved portion 813, and the cylindrical portion 812 may have a conical shape cutting off a vertex portion. In addition, the cylindrical portion 812 may have a curved side surface.

Referring to FIG. 9, in an airtight container 901 according to some example embodiments of the present inventive concepts, an opening diameter of a second curved portion 913 may be larger than an opening diameter of a first curved portion 911, similar to the case of FIG. 8. In addition, an opening of a cylindrical portion 912 has a size corresponding to the opening of the first curved portion 911 and the opening of the second curved portion 913, and the tubular, cylindrical portion 912 may have a hollow cylindrical shape.

In addition, a tip portion 914 may be disposed in a position other than the cylindrical portion 912. For example, the tip portion 913 may be disposed in any region other than the region in which the assist gas, which has become a high-speed molecular flow by the laser light, collides with the second curved portion 913. In other words, the tip portion 914 may be disposed in a region other than the region in which the optical axis of the laser light of the second curved portion 913 extends.

Referring to FIG. 10, in an airtight container 1000 according to another example embodiments of the present inventive concepts, a tip portion 1014 may be disposed on a second curved portion 1013. In some example embodiments, the tip portion 1014 may be disposed in a position in which an angle α with respect to to Z-axis direction (coinciding with a longitudinal axis of the airtight container 1000) from a center of the hemispherical shape of the second curved portion 1013 is greater than about 0 degrees and less than or equal to about 90 degrees. For example, the angle α may be about 15 degrees, about 30 degrees, about 45 degrees, about 60 degrees, or about 75 degrees.

As set forth above, according to example embodiments of the present inventive concepts, a light source apparatus may prolong a lifespan of the light source apparatus by decreasing, or suppressing the deterioration of the optical component, or the like.

In addition, the light source apparatus according to example embodiments of the present inventive concepts may be provided with a first curved portion, a second curved portion, and a cylindrical portion as a sealed container. By increasing a distance in which high-speed gas molecular flow of the assist gas converted into a plasma state reaches to a wall surface of the airtight container and lowering a temperature of the assist gas at a point of reaching the wall surface, it is possible to suppress an increase in the a wall surface temperature of the sealed container and to extend lifespan of the light source apparatus.

In addition, in the light source apparatus according to example embodiments of the present inventive concepts, since a flow of the assist gas converted into the plasma state does not reach the tip portion, it is possible to reduce or prevent occurrence of crystallization and/or cracking at the tip portion due to weak strength.

In addition, the light source apparatus according to example embodiments of the present inventive concepts may suppress attenuation (scattering) occurring when the laser light is condensed, by including a first curved portion having a curved shape into which laser light may be vertically incident.

The various and advantageous advantages and effects of the present invention are not limited to the above description, and can be more easily understood in the course of describing a specific embodiment of the present invention.

While example embodiments have been shown and described above, it will be apparent to those skilled in the art that modifications and variations could be made without departing from the scope of the present inventive concepts as defined by the appended claims.

What is claimed is:

1. A light source apparatus, comprising:
   an airtight container having a hemispherical or semielliptical first curved portion, a hemispherical or semielliptical second curved portion opposite to the first curved portion, and a cylindrical portion connecting the first curved portion and the second curved portion;
   assist gas sealed in the airtight container; and
   a light source configured to irradiate laser light to the first curved portion from outside of the airtight container.

2. The light source apparatus of claim 1, wherein the cylindrical portion further comprises a tip portion.

3. The light source apparatus of claim 1, wherein the second curved portion is provided with a tip portion, the tip portion in a position other than an optical axis of the laser light.

4. The light source apparatus of claim 1, further comprising:
   a mirror reflecting laser light from the light source and irradiating the laser light to the first curved portion of the airtight container,
   wherein a curved shape of the first curved portion has a portion into which the laser light is vertically incident.

5. The light source apparatus of claim 1, wherein the assist gas comprises at least one of Ar, Kr, Xe, He, Ne, $N_2$, $Br_2$, $Cl_2$, $I_2$, $H_2O$, $O_2$, $H_2$, $CH_4$, NO, $NO_2$, $CH_3OH$, $C_2H_5OH$, $CO_2$, $NH_3$, one or more metal halides, a Ne/Xe mixture, an Ar/Xe mixture, a Kr/Xe mixture, an Ar/Kr/Xe mixture, an ArHg mixture, a KrHg mixture, and a XeHg mixture.

6. The light source apparatus of claim 1, wherein the second curved portion has a diameter greater than a diameter of the first curved portion.

7. A light source apparatus, comprising:
   a light source configured to irradiate laser light;
   an airtight container configured to receive the laser light, the airtight container having a first curved portion, and a cylindrical portion connected to the first curved portion, the airtight container including a tip portion, the tip portion being sealed, the tip portion in a position other than an optical axis of the laser light, the first curved portion being hemispherical or semielliptical; and
   assist gas sealed in the airtight container.

8. The light source apparatus of claim 7, further comprising:
   a second curved portion, the second curved portion connected to the cylindrical portion and opposite the first curved portion.

9. The light source apparatus of claim 8, wherein the second curved portion is hemispherical or semielliptical.

10. The light source apparatus of claim 8, wherein the tip portion is on the second curved portion.

11. The light source apparatus of claim 7, wherein the tip portion is on the first curved portion.

12. The light source apparatus of claim 7, wherein the tip portion is on the cylindrical portion.

13. The light source apparatus of claim 7, further comprising a mirror reflecting laser light from the light source and irradiating the laser light to the first curved portion of the airtight container, wherein a curved shape of the first curved portion has a portion into which the laser light is vertically incident.

14. The light source apparatus of claim 7, wherein the assist gas comprises at least one of Ar, Kr, Xe, He, Ne, $N_2$, $Br_2$, $Cl_2$, $I_2$, $H_2O$, $O_2$, $H_2$, $CH_4$, NO, $NO_2$, $CH_3OH$, $C_2H_5OH$, $CO_2$, $NH_3$, one or more metal halides, a Ne/Xe mixture, an Ar/Xe mixture, a Kr/Xe mixture, an Ar/Kr/Xe mixture, an ArHg mixture, a KrHg mixture, and a XeHg mixture.

15. A light source apparatus, comprising:
a container having a first end portion receiving laser light, a second end portion opposite to the first portion, and a middle portion connecting the first end portion and the second end portion, the second end portion having a larger diameter than the first end portion; and
a light source configured to irradiate laser light to the first end portion from outside of the container.

16. The light source apparatus of claim 15, wherein the middle portion includes a tip portion, the tip portion configured to be sealed after insertion of an assist gas.

17. The light source apparatus of claim 15, wherein the first end portion includes a tip portion, the tip portion configured to be sealed after insertion of an assist gas, the tip portion in a position other than an optical axis of the laser light.

18. The light source apparatus of claim 15, wherein the second end portion includes a tip portion, the tip portion configured to be sealed after insertion of an assist gas, the tip portion in a position other than an optical axis of the laser light.

19. The light source apparatus of claim 15, further comprising:
a mirror reflecting laser light from the light source and irradiating the laser light to the first end portion of the container,
wherein a curved shape of the first end portion has a portion into which the laser light is vertically incident.

20. The light source apparatus of claim 15, further comprising:
an assist gas in the container.

* * * * *